United States Patent
Kato

(10) Patent No.: US 9,319,074 B2
(45) Date of Patent: Apr. 19, 2016

(54) COMMUNICATION DEVICE, COMMUNICATION METHOD, AND COMMUNICATION PROGRAM

(71) Applicant: PANASONIC CORPORATION, Osaka (JP)

(72) Inventor: Osamu Kato, Fukuoka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 166 days.

(21) Appl. No.: 14/292,410

(22) Filed: May 30, 2014

(65) Prior Publication Data

US 2014/0317466 A1    Oct. 23, 2014

Related U.S. Application Data

(63) Continuation-in-part of application No. PCT/JP2012/007412, filed on Nov. 19, 2012.

(30) Foreign Application Priority Data

Dec. 1, 2011    (JP) ................................. 2011-263958

(51) Int. Cl.
  *H03M 13/00*    (2006.01)
  *H03M 13/45*    (2006.01)
  (Continued)

(52) U.S. Cl.
  CPC .......... *H03M 13/453* (2013.01); *H03M 13/373* (2013.01); *H03M 13/3715* (2013.01); *H03M 13/451* (2013.01); *H04L 1/0045* (2013.01); *H03M 13/1515* (2013.01)

(58) Field of Classification Search
  CPC ......................... H03M 13/453; H03M 13/373
  See application file for complete search history.

(56) References Cited

U.S. PATENT DOCUMENTS 5,600,663 A * 2/1997 Ayanoglu .............. H03M 13/35
                                                     714/751
5,995,519 A * 11/1999 Miwa .................... H04L 1/0057
                                                     370/509

(Continued)

FOREIGN PATENT DOCUMENTS

| JP | 8-97730 A | 4/1996 |
| JP | 2010-187097 A | 8/2010 |
| JP | 2012-147197 A | 8/2012 |

OTHER PUBLICATIONS

Argon, C.; McLaughlin, S.W.; Souvignier, T., "Iterative application of the Chase algorithm on Reed-Solomon product codes," in Communications, 2001. ICC 2001. IEEE International Conference on , vol. 1, no., pp. 320-324 vol. 1, Jun. 11-14, 2001.*

(Continued)

*Primary Examiner* — Joseph D Torres
(74) *Attorney, Agent, or Firm* — Seed IP Law Group PLLC

(57) ABSTRACT

A device receives reception packets including information packets that contains information symbols and check packets that contains check symbols and divides each packet into a plurality of symbols, that configure FEC codes, detects whether each packet of the reception packets is a normal reception packet or an abnormal reception packet, generates a plurality of FEC decode candidates configured by a normal symbol included in the normal reception packet and an uncertain symbol included in the abnormal reception packet and generated to have the uncertain symbol different from one another for each of the FEC codes and performs a first error correction on the plurality of FEC decode candidates, and corrects the FEC codes based on consistent results of the first error correction among a plurality of results of the first error correction that is performed on the plurality of FEC decode candidates.

12 Claims, 11 Drawing Sheets

(51) Int. Cl.
*H03M 13/37* (2006.01)
*H04L 1/00* (2006.01)
*H03M 13/15* (2006.01)

(56) References Cited

U.S. PATENT DOCUMENTS

| | | | | |
|---|---|---|---|---|
| 6,634,007 | B1* | 10/2003 | Koetter | H03M 13/132 714/782 |
| 7,904,781 | B2* | 3/2011 | Sugai | H04L 1/0045 714/752 |
| 2003/0021240 | A1* | 1/2003 | Moon | H04B 7/2631 370/320 |
| 2004/0247238 | A1* | 12/2004 | Argon | G02B 6/4202 385/24 |
| 2009/0016469 | A1* | 1/2009 | Li | H03M 13/3707 375/341 |
| 2009/0245195 | A1* | 10/2009 | Bhattad | H04L 5/0053 370/329 |
| 2011/0099446 | A1* | 4/2011 | Murakami | H04L 1/0041 714/748 |
| 2011/0289540 | A1 | 11/2011 | Yachida | |
| 2012/0179947 | A1 | 7/2012 | Kato | |

OTHER PUBLICATIONS

Arai et al., "Analysis of Using Convolutional Codes to Recover Packet Losses over Burst Erasure Channels," IEEE Pacific Rim International Symposium, Dependable Computing, Dec. 17-19, 2001, Seoul, Korea, pp. 258-265.

International Search Report dated Jan. 29, 2013, for corresponding International Application No. PCT/JP2012/007412, 5 pages.

Uchida et al., "A Study on Reliable Data Transfer with Erasure Correction Code," NEN IEICE Communications Society Conference Koen Ronbunshu 1, B-17-15, Sep. 7, 2006, p. 525 (3 pages).

* cited by examiner

COMMUNICATION DEVICE, COMMUNICATION METHOD, AND COMMUNICATION PROGRAM

BACKGROUND

1. Field of the Invention

The present invention relates to a communication device, a communication method, and a program.

2. Description of the Related Art

In an electronic, device in the related art, error detection or error correction is generally performed in order to secure data reliability, in digital communication processing that is performed between the electronic device and an external communication device and signal processing that is performed on data that is obtained by a digital communication or on data that is stored in a storage device. With the error detection, it can be identified whether or not an error has occurred in the data. Furthermore, with the error correction, it can be identified whether or not the error has occurred in the data, and additionally the data in which the error is present can be corrected.

There is a type of error detection or error correction that is called a block code that converts a code with k unit lengths (k bits or the like) into a codeword with (n=m+k) unit lengths. These are described as (n and k) codes and the like. In the codeword, a minimum Hamming distance is d>1, that is, there is a difference of at least d units. The error detection or the error correction is accomplished using this redundancy.

In the error detection, the error with (d−1) units can be detected per codeword, and in the error correction, the error with [(d−1)/2] units can be corrected per codeword ([ ] indicates a floor function).

There is a forward error correction code (hereinafter referred to as an "FEC code") as one of the codes that are used in the error correction, and a Reed Solomon code (hereinafter referred to as an "RS code") is known as one of the codes. While the processing takes a certain amount of time because the RS code is complex in terms of generation and decoding, the RS code is excellent in terms of the ability to correct an error and is applied to error correction in digital terrestrial broadcasting, satellite communication, ADSL, CD, DVD, QR code (a registered trademark) and the like. Furthermore, in the RS code, the codeword is expressed with a combination of symbols, and the error detection and the error correction are performed in each symbol unit. Then, regardless of how many errors are included in bits within one symbol, because they are recognized as the error in one symbol as a whole, the RS code has characteristics in that it is strongly resistant to burst errors that are bit errors that occur successively. The codeword in the RS code is expressed, for example, as an RS (n, k) code or simply as an RS (n, k).

Furthermore, in the error correction of the RS code, the error correction in a case where an error position is specified in advance is called the erasure correction. By the erasure correction, up to the errors in (n−k) symbols or fewer can be properly error-corrected per codeword.

An image quality estimation device that is capable of estimating image quality of image data by using the FEC code is known as an example of a technology that uses the FEC code (for example, refer to JP-A-2010-187097).

Furthermore, where the number of information packets is k, the number of check packets is m, and the number n of transmission packets=k+m, it is possible to restore (error-correct) up to an arbitrary (n−k)=m packets loss among the n transmission packets.

SUMMARY

However, in the error correction that uses the FEC code in the related art, when the number of the normal reception packets that are normally received, among n packets, is not equal to or more than k, the k information packets cannot be restored.

An object of the present invention is to provide a communication device, a communication method, and a communication program that are capable of improving error correction ability.

A communication device according to an aspect of the present invention is a communication device for performing a communication with a different communication device, the communication device including: a receiver that receives reception packets including information packets that contains information symbols and check packets that contains check symbols and divides each packet into a plurality of symbols, wherein the information packets and the check packets configure FEC codes; a first error detector that detects whether each packet of the reception packets is a normal reception packet or an abnormal reception packet; a first error correcting unit that generates a plurality of FEC decode candidates for each of the FEC codes and performs a first error correction on the plurality of FEC decode candidates, wherein each of the plurality of FEC decode candidates is configured by a normal symbol included in the normal reception packet and an uncertain symbol included in the abnormal reception packet and generated to have the uncertain symbol different from one another; and a second error correcting unit that corrects the FEC codes based on consistent results of the first error correction among a plurality of results of the first error correction that is performed on the plurality of FEC decode candidates by the first error correcting unit.

A communication method according to an aspect of the present invention includes the steps of receiving reception packets and dividing each packet into a plurality of symbols; performing a first error correction using a plurality of FEC decode candidates configured by normal symbols and uncertain symbols included in the divided symbols; and performing a second error correction using consistent results among a plurality of results of the first error correction.

A communication program according to an aspect of the present invention is a program for causing a computer to execute each step of the communication method.

According to the present invention, it is possible to improve the error correction ability.

DETAILED DESCRIPTION

Figure 1:
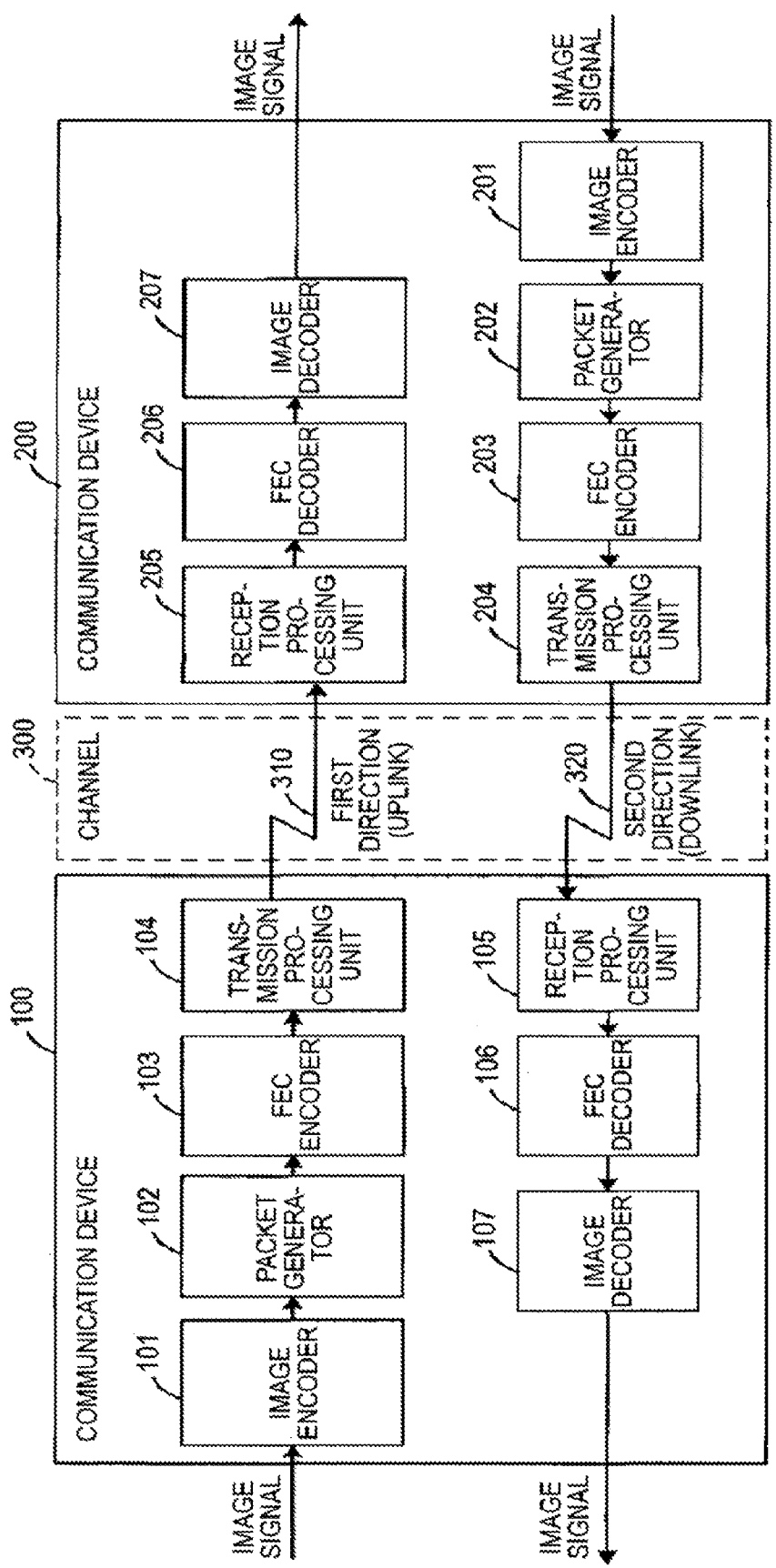
FIG. 1 is a configuration example of a communication system according to a first embodiment of the present invention.

Embodiments of the present invention are described below referring to the drawings.

As a communication device according to the present embodiment, a communication device that performs communication through a cable, such as a wired LAN, a coaxial cable, a power line, or the like, a communication device that performs communication through a radio technology such as a cellular communication, a wireless LAN, Bluetooth (a registered trademark), or the like, and the like are considered.

Furthermore, the communication device according to the present embodiment is a communication device that performs packet transmission. As examples of the communication device, there are communication devices for use in a television conference system, a system that transmits an image obtained by a monitoring camera, a system that downloads or uploads image data, a remote teaching system, and the like. Furthermore, the communication device is very suitable as a communication device that performs communication by using a channel that has a comparatively high error rate for packets, such as a radio channel.

(Specific Arithmetic Operation for Error Correction and Erasure Correction)

The communication device according to the present embodiment performs error correction, particularly erasure correction. First, a specific arithmetic operation method for the error correction and the erasure correction is described before describing each embodiment.

Here, it is assumed that data is transmitted from a transmission device, which is one communication device, to a reception device, which is another communication device, and RS (15, 7), that is, a case where k=7, m=8, and n=15 is illustrated. Furthermore, one symbol is set to be 8 bits. The data in RS (15, 7) includes pieces of information data $D_0$ to $D_6$ that have to be actually transmitted and pieces of parity data $P_0$ to $P_7$ for performing check.

First, the transmission device and the reception device prepare and store the following eighth-degree generation polynomial G(x).

[Equation 1]

$$G(x)=(x+\alpha^7)(x+\alpha^6)(x+\alpha^5)(x+\alpha^4)(x+\alpha^3)(x+\alpha^2)(x+\alpha^1)(x+\alpha^0) \quad \text{(EXPRESSION 1)}$$

The transmission device determines pieces of parity data $P_0$ to $P_7$ in such a manner that the following expression holds, based on the pieces of information data $D_0$ to $D_6$.

[Equation 2]

$$x^8 \cdot \sum_{i=0}^{6} x^i \cdot D_i \bmod G(x) = \sum_{i=0}^{7} x^i \cdot P_i \quad \text{(EXPRESSION 2)}$$

Next, $D_6=W_{14}$, $D_5=W_{13}$, and so forth down to $D_0=W_8$, and $P_7=W_7$, $P_6=W_6$, and so forth down to $P_0=W_0$ are set. $W_0$ to $W_{14}$ are transmission symbols. W(x) is divided by G(x) from Equation 2 when W(x) is defined as follows.

[Equation 3]

$$W(x) = \sum_{i=0}^{14} x^i \cdot W_i = W_{14}x^{14} + W_{13}x^{13} + \ldots + W_1 x + W_0 \quad \text{(EXPRESSION 3)}$$

Therefore, when W(x)=G(x)·A(x)+B(x) meets, B(x)=0. When $x=\alpha^0$, $x=\alpha^1$, $x=\alpha^2$, and so forth up to $x=\alpha^7$ are substituted into both sides of Equation 3, the following equation can be obtained.

[Equation 4]

$$\begin{cases} W(\alpha^0) = G(\alpha^0)A(\alpha^0) = 0 \times A(\alpha^0) = 0 \\ W(\alpha^1) = G(\alpha^1)A(\alpha^1) = 0 \times A(\alpha^1) = 0 \\ \ldots \\ W(\alpha^7) = G(\alpha^7)A(\alpha^7) = 0 \times A(\alpha^7) = 0 \end{cases} \quad \text{(EXPRESSION 4)}$$

In this manner, an equation that has to be satisfied is present in the transmission symbols $W_0$ to $W_{14}$ that are transmitted by the transmission device (a condition for restricting the transmission device).

On the other hand, the reception device receives reception symbols $R_0$ to $R_{14}$ from the transmission device. The following relationship is present between the transmission symbols and the reception symbols.

[Equation 5]

$$\begin{cases} W_{14} + E_{14} = R_{14} \\ W_{13} + E_{13} = R_{13} \\ \ldots \\ W_0 + E_0 = R_0 \end{cases} \quad \text{(EXPRESSION 5)}$$

That is,

[Equation 6]

$$R(x) = \sum_{i=0}^{14} x^i (W_i + E_i) = \sum_{i=0}^{14} x^i \cdot R_i \quad \text{(EXPRESSION 6)}$$

$E_i$ indicates an error symbol that is superimposed onto such a transmission symbol on the channel.

Here,

[Equation 7]

$$\begin{cases} E(x) = \sum_{i=0}^{14} x^i \cdot E_i = E_{14}x^{14} + E_{13}x^{13} + \ldots + E_1 x + E_0 \\ R(x) = \sum_{i=0}^{14} x^i \cdot R_i = R_{14}x^{14} + R_{13}x^{13} + \ldots + R_1 x + R_0 \end{cases} \quad \text{(EXPRESSION 7)}$$

is given as above, Equation 6 is expressed as follows.

$$W(x)+E(x)=R(x)$$

When $x=\alpha^0$, $x=\alpha^1$, $x=\alpha^2$, and so forth up to $x=\alpha^7$ are substituted into both sides of Equation 7, the following equation can be obtained using a syndrome $S_i$.

[Equation 8]

$$\begin{cases} W(\alpha^0) + E(\alpha^0) = E(\alpha^0) = R(\alpha^0) = S_0 \\ W(\alpha^1) + E(\alpha^1) = E(\alpha^1) = R(\alpha^1) = S_1 \\ \ldots \\ W(\alpha^7) + E(\alpha^7) = E(\alpha^7) = R(\alpha^7) = S_7 \end{cases} \quad \text{(EXPRESSION 8)}$$

That is the reception device can uniquely determine 8 syndromes, based on the error symbol $E(x)$ that is superimposed on the transmission symbol on the channel.

Furthermore, when $x=\alpha^0$, $x=\alpha^1$, $x=\alpha^2$, and so forth up to $x=\alpha^7$ are substituted into $E(x)$ from Equation 7 and Equation 8, the following result is obtained.

[Equation 9]

$$\begin{cases} E(\alpha^0) = E_{14}\alpha^0 + E_{13}\alpha^0 + \ldots + E_1 \alpha^0 E_0 \alpha^0 = S_0 \\ E(\alpha^1) = E_{14}\alpha^{14} + E_{13}\alpha^{13} + \ldots + E_1 \alpha^1 E_0 \alpha^0 = S_1 \\ E(\alpha^2) = E_{14}\alpha^{28} + E_{13}\alpha^{26} + \ldots + E_1 \alpha^2 E_0 \alpha^0 = S_2 \\ \ldots \\ E(\alpha^7) = E_{14}\alpha^{98} + E_{13}\alpha^{91} + \ldots + E_1 \alpha^7 E_0 \alpha^0 = S_7 \end{cases} \quad \text{(EXPRESSION 9)}$$

When the number of $E_i$'s, where $E_i \neq 0$ (non zero), in each error symbol $E_i$ is set to be P, and substitution of $i=L(0), L(1)$, and so forth up to $L(P-1)$ is made, the following equation holds from Equation 9. Moreover, an asterisk "*" indicates multiplication.

[Equation 10]

$$\begin{bmatrix} \alpha^0 & \alpha^0 & \ldots & \alpha^0 & \alpha^0 \\ \alpha^{L(0)} & \alpha^{L(1)} & \ldots & \alpha^{L(P-2)} & \alpha^{L(P-1)} \\ \alpha^{2L(0)} & \alpha^{2L(1)} & \ldots & \alpha^{2L(P-2)} & \alpha^{2L(P-1)} \\ \ldots & & & & \\ \alpha^{(P-2)*L(0)} & \alpha^{(P-2)*L(1)} & \ldots & \alpha^{(P-2)*L(P-2)} & \alpha^{(P-2)*L(P-1)} \\ \alpha^{(P-1)*L(0)} & \alpha^{(P-1)*L(1)} & \ldots & \alpha^{(P-1)*L(P-2)} & \alpha^{(P-1)*L(P-1)} \end{bmatrix} \begin{bmatrix} E_{L(0)} \\ E_{L(1)} \\ E_{L(2)} \\ \ldots \\ E_{L(P-2)} \\ E_{L(P-1)} \end{bmatrix} = \begin{bmatrix} S_0 \\ S_1 \\ S_2 \\ \ldots \\ S_{P-2} \\ S_{P-1} \end{bmatrix} \quad \text{(EXPRESSION 10)}$$

In the case of RS (15, 7), it is possible to perform the erasure correction when P=0 to 8, that is, until the maximum number of the error symbols is 8. On the other hand, when P≥9, that is, when the number of the error symbols is 9 or greater, the erasure correction cannot be performed.

For example, when the error occurs at positions that are i=5, 8, and 13, the following equation holds.

[Equation 11]

$$\begin{cases} E_{13}\alpha^0 + E_8\alpha^0 + E_5\alpha^0 = S_0 \\ E_{13}\alpha^{13} + E_8\alpha^8 + E_5\alpha^5 = S_1 \\ E_{13}\alpha^{26} + E_8\alpha^{16} + E_5\alpha^{10} = S_2 \end{cases} \quad \text{(EXPRESSION 11)}$$

The reception device can recognize values of syndromes $S_0$, $S_1$, and $S_2$ using the reception symbol and can recognize also an $\alpha$ value from a definition equation, the generation polynomial $G(x)$. Therefore, if a loss symbol position (an i value) that is a position at which the error occurs can be recognized, values of error symbols $E_5$, $E_8$, and $E_{13}$ can be calculated and the erasure correction can be performed.

First Embodiment

FIG. 1 is a diagram illustrating a configuration example of a communication system according to a first embodiment of the present invention. In the communication system illustrated in FIG. 1, a communication device 100 and a communication device 200 are connected to each other over a channel 300.

The channel 300 broadly includes a communication channel, such as a wired line such as a power line or a wired LAN, and a radio channel such as a cellular communication, or the wireless LAN. Furthermore, it is considered that a base station, a core network, the Internet, and the like are included. Furthermore, the channel 300 includes a first channel 310 over which the data is transmitted in a direction (a first direction) from the communication device 100 to the communication device 200 and a second channel 320 over which the data is transmitted in a direction (a second direction) from the communication device 200 to the communication device 100.

The communication device 100 is configured to include an image encoder 101, a packet generator 102, an FEC encoder 103, a transmission processing unit 104, a reception processing unit 105, an FEC decoder 106, and an image decoder 107.

The image encoder 101 encodes an image signal that is received from an external device or the image signal that is output from a memory that is not illustrated, and generates an image code. The image code is one example of an information symbol. Here, a well-known method is used as a method of encoding the image signal. Moreover, if the encoding of the image signal is performed at a variable rate, the number of information packets that are generated for a given time is variable.

The packet generator 102 generates a packet (an information packet) that includes the information symbol as the image code (refer to FIG. 3 that is described below).

The FEC encoder 103 encodes (performs FEC encoding on) the information symbol that configures the information packet from the packet generator 102, with FEC and generates an FEC code with a fixed length. When performing the FEC encoding, Equation 1 to Equation 4 that are described above are considered. As the FEC code, there is an RS code and the like that are made from the information symbol and a check symbol. Details of the FEC encoding are described below. The packet that is encoded by the FEC encoder 103 is hereinafter referred to as a generation packet as well (refer to FIG. 3 that is described below). The head of the generation packet includes identification information for identifying the generation packet and a header in which information relating to such a generation packet is described.

Moreover, the generation packet that is generated in the FEC encoder 103 is a packet in a layer 7 of an OSI reference model (is an application layer and is hereinafter simply referred to as an "application layer") (refer to FIG. 3 that is described below).

The transmission processing unit 104 assigns a cyclic redundancy check (CRC), based on each symbol (the information symbol, the check symbol, and the like) that is included in the generation packet from the FEC encoder 103. The CRC is one error detection code. The packet that includes the generation packet and the CRC is hereinafter referred to as a transmission packet (refer to FIG. 3 that is described below). The head of the transmission packet includes identification information for identifying the transmission packet and a header in which information relating to such a transmission packet is described. The transmission processing unit 104 transmits the generated transmission packet to the first channel 310.

Moreover, the transmission packet that is generated by the transmission processing unit 104 is a packet in a layer 2 (a data link control layer, which is hereinafter referred to as a "data link control (DLC) layer," or a "layer 2") of the OSI reference model (refer to FIG. 3 that is described below). Moreover, in a case of a radio protocol, the DLC is referred to as a radio link control (RLC). Therefore, the CRC that is assigned by the transmission processing unit 104 is the CRC (the CRC of the DLC layer) for performing the error detection in the DLC layer. The CRC of the DLC layer is the data for determining whether or not the error occurs in the symbol within the packet due to the communication.

The reception processing unit 105 receives the packet from the second channel 320. The packet that is received by the reception processing unit 105 is hereinafter referred to as a reception packet (refer to FIG. 3 that is described below). The reception packet includes the FEC code that is configured by the information packet and the check packet. If the packet is received from the communication device 200, the reception packet is the same as the transmission packet of the communication device 200 in an ideal case where a channel error is not superimposed in the channel 300. The reception packet is the packet in the DLC layer (refer to FIG. 3 that is described below). In this manner, the reception processing unit 105 functions as a receiver that receives the reception packet. The reception packet is divided into multiple symbols by the reception processing unit 105.

Furthermore, the reception processing unit 105 performs the error detection (a first error detection) that uses the CRC of the DLC layer on the reception packet. If a result of the error detection is that the reception packet is normal (OK), the reception processing unit 105 sets such a reception packet to be a normal reception packet ($P_G$) and counts the number (a) of the normal reception packets. On the one hand, if the reception packet is abnormal (NG), the reception processing unit 105 sets such a reception packet to be an abnormal reception packet ($P_N$) and counts the number (b) of the abnormal reception packets. In this manner, the reception processing unit 105 functions as a first error detector that performs first error detection on the reception packet.

Furthermore, the reception processing unit 105 recognizes a loss packet ($P_L$) that is transmitted from the communication device 100, but is not received by the communication device 200 and counts the number (c) of the loss packets. The loss packet can be recognized from the identification information (for example, a transmission packet number) of the transmission packet that is included in the header of the reception packet.

The reception processing unit 105 outputs information on the reception packet the normal reception packet ($P_G$) and the abnormal reception packet ($P_N$)), the number (a) of the normal reception packets, the number (b) of the abnormal receptions, and the number (c) of the loss packets to the FEC decoder 106.

Moreover, each symbol that is included in the normal reception packet ($P_G$) is a normal symbol. Each symbol that is included in the abnormal reception packet ($P_N$) is an uncertain symbol. Each symbol that is included in the abnormal reception packet ($P_L$) is a loss symbol. Furthermore, the error symbol includes the loss symbol and the symbol that is different from the data that is present at the time of the transmission, which is one portion of the uncertain symbol.

With FEC, the FEC decoder 106 decodes (performs FEC decoding on) the reception packet from the reception processing unit 105. When performing the FEC decoding, Equation 5 to Equation 11 described above are considered. The packet that is FEC-decoded by the FEC decoder 106 is hereinafter referred to as a decoded packet as well (refer to FIG. 3 that is described below). The decoded packet is the packet in the application layer (refer to FIG. 3 that is described below).

Details of the FEC decoding are described below, but the FEC decoder 106 functions as an FEC decode candidate generator that generates a plurality of FEC decode candidates, each of which is configured by the entire normal symbol and one portion of the uncertain symbol, for each FEC code, in such a manner that the uncertain symbols differ from one another.

Moreover, here, the FEC decode candidate is a combination of the symbols that are regarded as not being lost in a case of performing FEC decoding processing, specifically, a combination of the normal symbol and the uncertain symbol as described above.

Furthermore, the FEC decoder 106 functions as a first error correcting unit that performs the error correction (a first error correction) on the FEC decode candidate.

Furthermore, the FEC decoder 106 functions as a second error correcting unit that corrects (performs a second error correction on) the FEC code, based on consistent results of the error correction (the first error correction) among results of the multiple error corrections (the first error corrections) that are performed on the multiple FEC decode candidates.

The image decoder 107 decodes the image signal as the information symbol that is included in the information packet from the FEC decoder 106 and obtains the image signal. Here, a well-known method is used as a method of decoding the image signal. Moreover, image data is assumed as user data, but other items of data such as sound data may be possible.

The communication device 200 is configured to include an image encoder 201, a packet generator 202, an FEC encoder 203, a transmission processing unit 204, a reception processing unit 205, an FEC decoder 206, and an image decoder 207.

Because constituent units of the communication device 200 have the same names and the same functions as those of the communication device 100, here, descriptions thereof are omitted. However, the channel 300 (the first channel 310 and the second channel 320) have opposite transmission and reception directions.

Because operation of the communication device 100 and operation of the communication device 200 are the same, the operation relating to the transmission and the operation relating to the reception are described below, using the operation of the communication device 100 and the communication device 200 as examples, respectively. Furthermore, the RS code is assumed to be mainly used as the FEC code.

Figure 2:
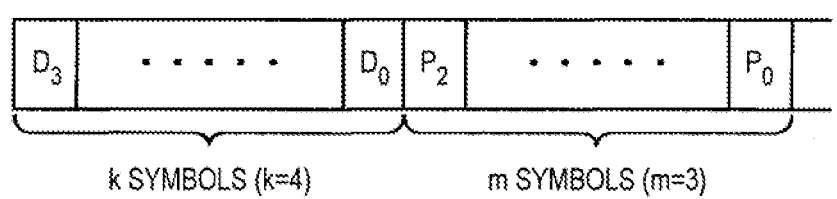
FIG. 2 is a configuration example of an RS code according to the first embodiment of the present invention.

Furthermore, according to the present embodiment, only one type of RS code (7, 4) in which the number of the information symbols is 4 and the number of the check symbols is 3 is assumed to be used. That is, k=4, m=3, and n=7, and the RS code illustrated in FIG. 2 is assumed to be used. Moreover, each of the communication devices 100 and 200 stores, in advance, information on the number (k) of the information symbols that are included in the transmission packets of the communication devices 200 and 100 that are communication parties and on the number (n) of the symbols of the transmission packets. Moreover, the number of the check symbols is set to be n−k.

Next, the FEC encoding is described in detail.

Figure 3:
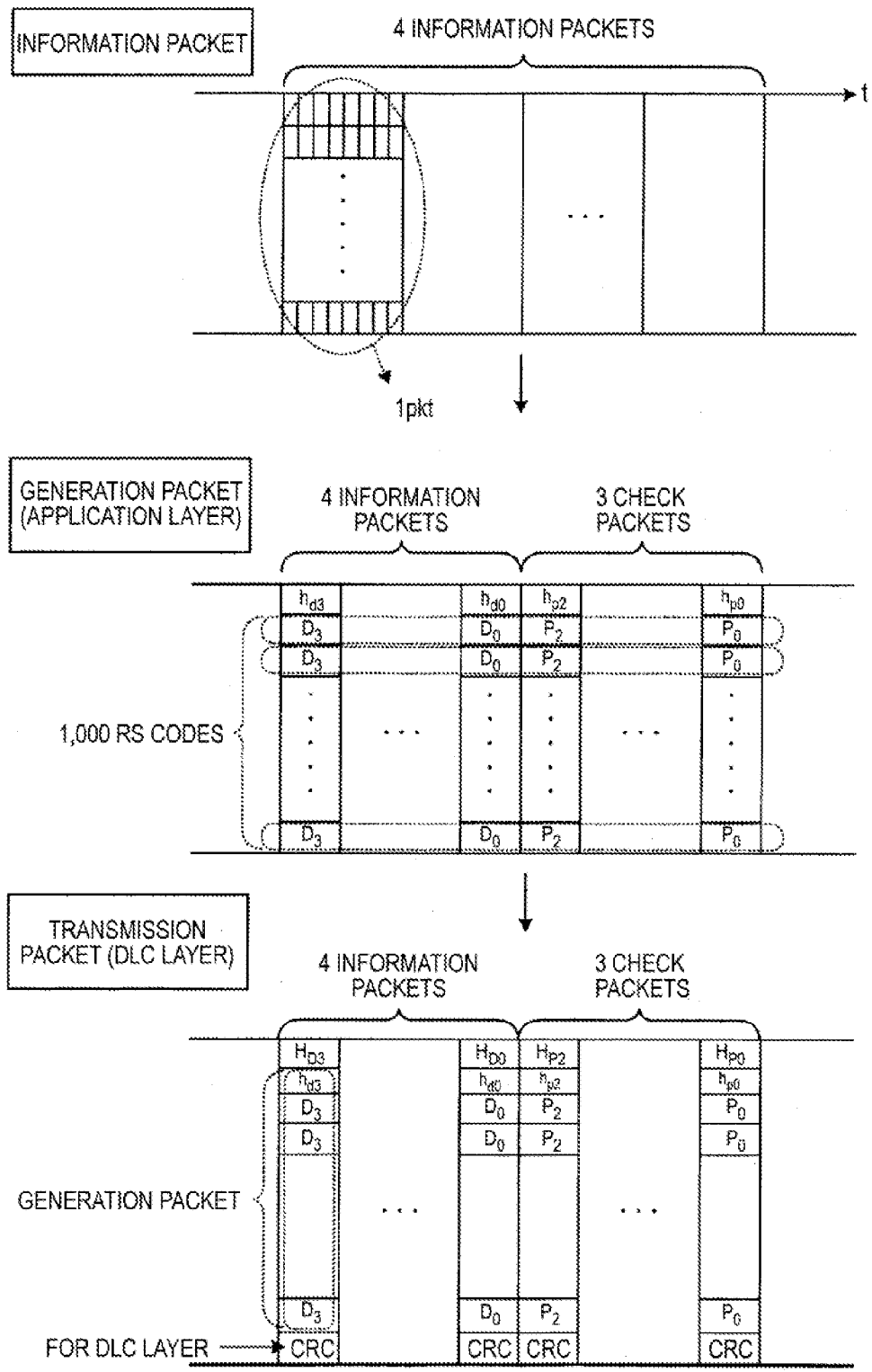
FIG. 3 is a diagram for describing FEC encoding according to the first embodiment of the present invention.

FIG. 3 is a diagram for describing the FTC encoding.

The image encoder 101 encodes the image signal, and the packet generator 102 converts the encoded image signal into the information packet. Here, 1 pkt in FIG. 3 indicates the information packet for one packet, and for example, corresponds to 1,000 symbols (8,000 bits) for the information symbols. Here, the division into 4 information packets is made. Furthermore, 8 bits are set to correspond to one symbol. Moreover, according to the present embodiment, because a data size of one packet is large, the division into 1000 symbols is made, but if one packet is divided into two or more symbols, the error correction according to the present embodiment can be applied.

Subsequently, the FEC encoder 103 performs the FEC encoding by adding 3 check packets per 4 information packets, in a manner that achieves RS (7, 4). Here, the division into 7 packets (4 information packets and 3 Check packets) is performed, and the 7 packets are equivalent to 1000 RS (7, 4) codes.

Furthermore, the FEC encoder 103, as illustrated in FIG. 3, assigns a header to a head of each of the information packet and the check packet in the generation packet.

Subsequently, the transmission processing unit 104 assigns the CRC determined from the generation packet and generates the transmission packet. Furthermore, as illustrated in FIG. 3, a header is assigned to the head of each of the information packet and check packet in the transmission packet. The transmission processing unit 104 transmits such a transmission packet to the communication device 200 over the first channel 310.

Next, the FEC decoding is described in detail.

According to the present embodiment, the erasure correction is mainly performed as the error correction. The erasure correction is described mainly below.

Figure 4:
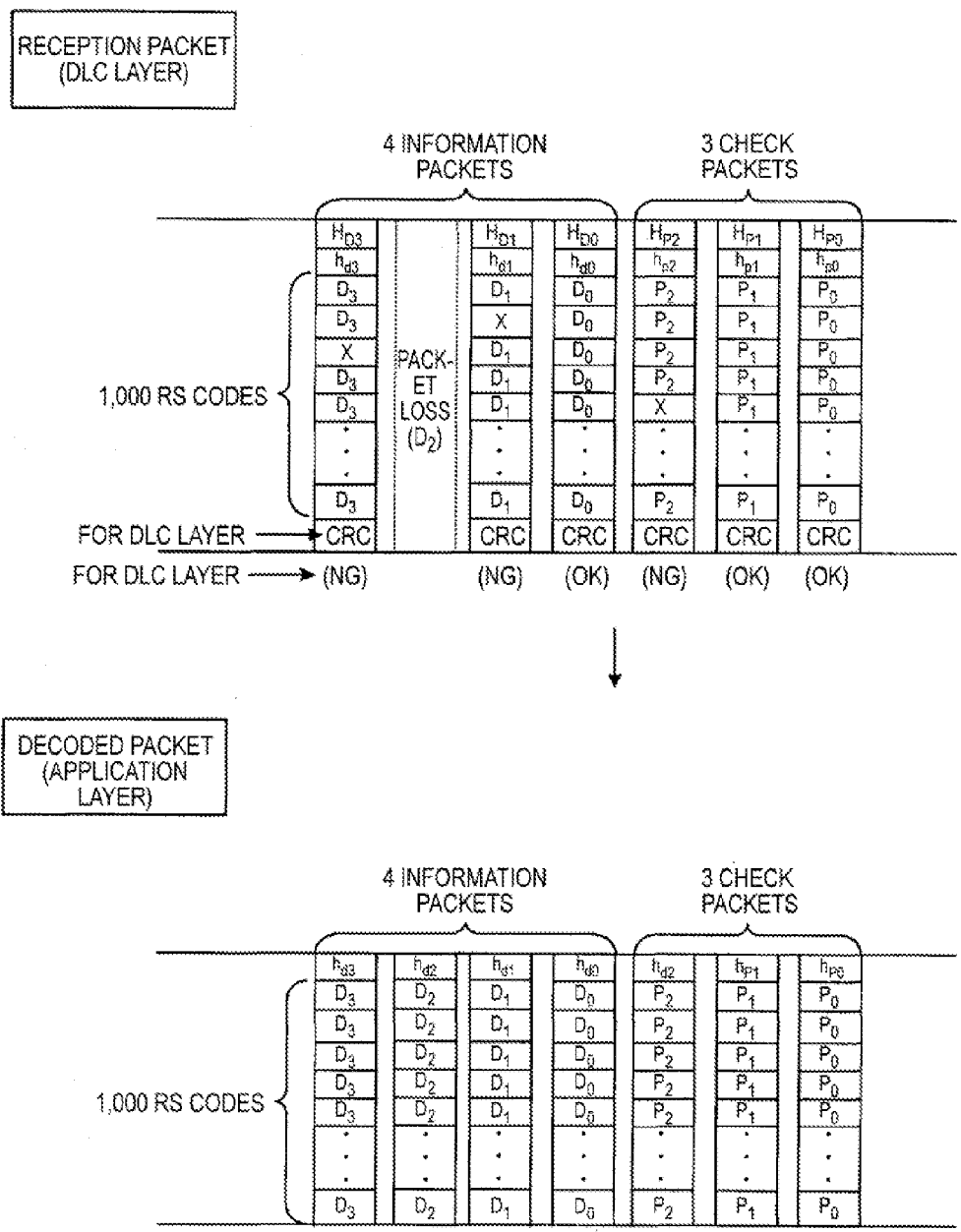
FIG. 4 is a diagram for describing FEC decoding according to the first embodiment of the present invention.

FIG. 4 is a diagram for describing the FEC decoding.

Moreover, while the transmitted packet is in transit over the first channel 310, the corresponding data may be changed or suffer a loss and thus an error (a bit error) occurs. In this case, because it is not possible to normally determine in which one of the symbols the error is present in the abnormal reception packet in which the error occurs, for convenience, a symbol "x" is defined as a wrong symbol in FIG. 4.

The reception processing unit 205 receives the reception packet. The reception packet includes the information packet including the information symbol and the check packet including the check symbol, that configure the FEC code, but the error occurs in some of the symbols or the packet may suffer a loss, depending on a communication environment, of the first channel 310.

In an example in FIG. 4, the error occurs in one portion of a first information packet that includes an information symbol $D_3$ that is transmitted by the communication device 100 and in one portion of a third information packet that includes the information symbol $D_1$, and all second information packets each of which includes an information symbol $D_2$ suffer a loss (the packet loss). In the same manner, the error occurs in one portion of a first check packet that includes a check symbol $P_2$ that is transmitted by the communication device 100. In FIG. 4, first to fourth information packets and first to third check packets are assumed to be arranged in this order from left to right.

Furthermore, the reception processing unit 205 performs the error detection on the first information packet, the third information packet, the fourth information packet, and the first check packet to the third check packet, all of which are received, by using the CRC of the DLC layer. In the error detection, it is determined that the fourth information packet, the second check packet, and the third check packet that have no error are normally received (OK), and it is determined that the first information, the third information packet, and the first check packet that have no error are abnormally received (NG). On the one hand, the error detection cannot be performed on the second information packet that is not received.

Referring to the header of the reception packet, the reception processing unit 205 outputs to the FEC decoder 206 the packet (the packet that is configured by the information symbol or the check symbol, and the header of the generation packet) that corresponds to the generation packet that is included in the reception packet.

Subsequently, the FEC decoder 206 receives the packet from the reception processing unit 205 and performs the erasure correction. Moreover, because based on information on the reception packet from the reception processing unit 205, the FEC decoder 206 can determine which packet at certain packet position is the normal reception packet, the abnormal reception packet, or the loss packet, it is possible for the FEC decoder 206 to perform the erasure correction.

Furthermore, in FIG. 4, because the number (a) of the normal reception packets=3, the number (b) of the abnormal reception packets=3, and the number (c) of the loss packets=1, the RS code cannot be restored simply by performing the erasure correction on the received packet. The details are described below, but the FEC decoder 206 combines the normal reception packet and one portion of the abnormal reception packet and thus generates the FEC decode candidate and restores the FEC code, based on a result of performing the erasure correction on such an FEC decode candidate. If a predetermined condition is satisfied, like for the decoded packet illustrated in FIG. 4, original data can be correctly restored by performing the erasure correction described above.

Moreover, unlike in the example in FIG. 4, for example, if the number (k) of the information packets that are included in the FEC code=4 and the number (a) of the normal reception packets=4, the original data can be restored by performing general erasure correction without the need to consider the erasure correction that is performed on the FEC decode candidate described above.

Next, operation of the reception processing unit 205 and operation of the FEC decoder 206 are described.

Figure 5:
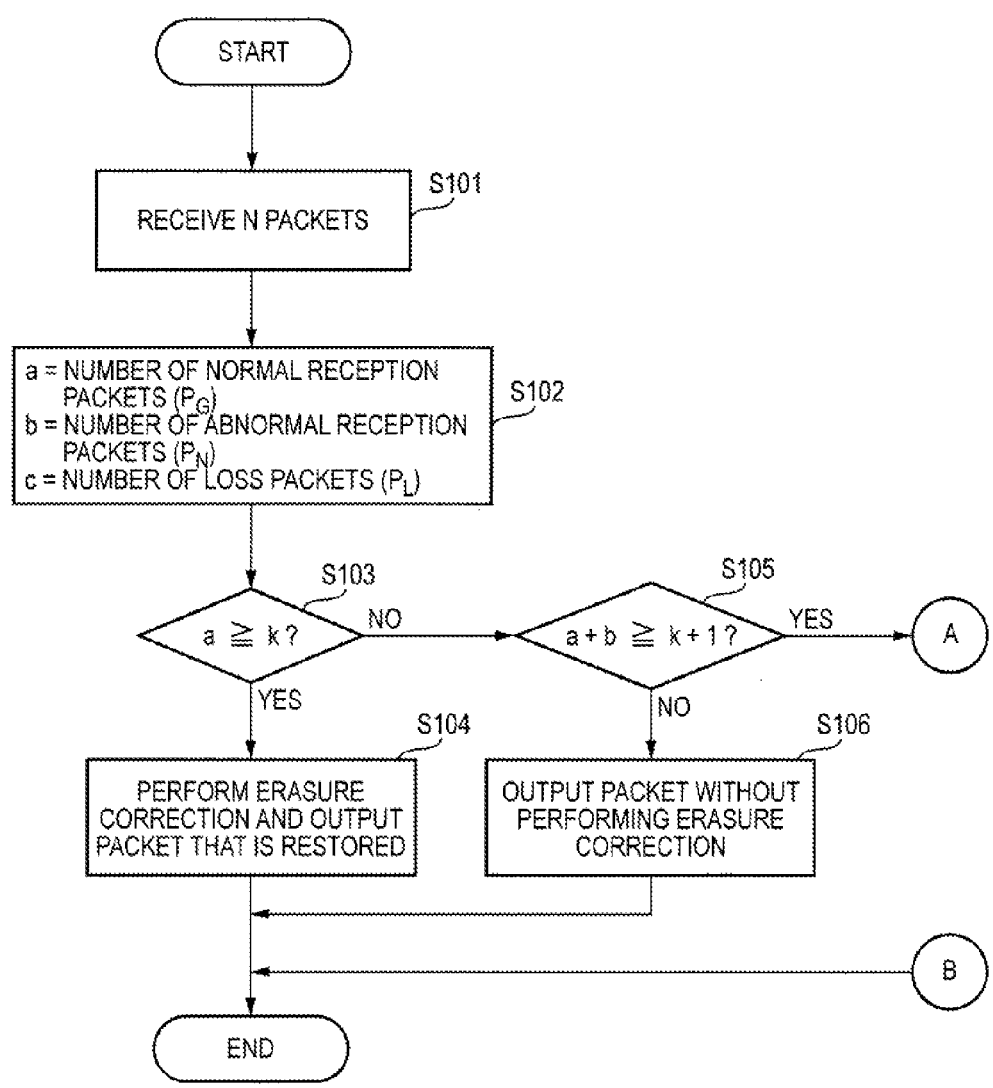
FIG. 5 is a flowchart, illustrating an operation example of a reception processing unit and an operation example of an FEC decoder according to the first embodiment.
Figure 6:
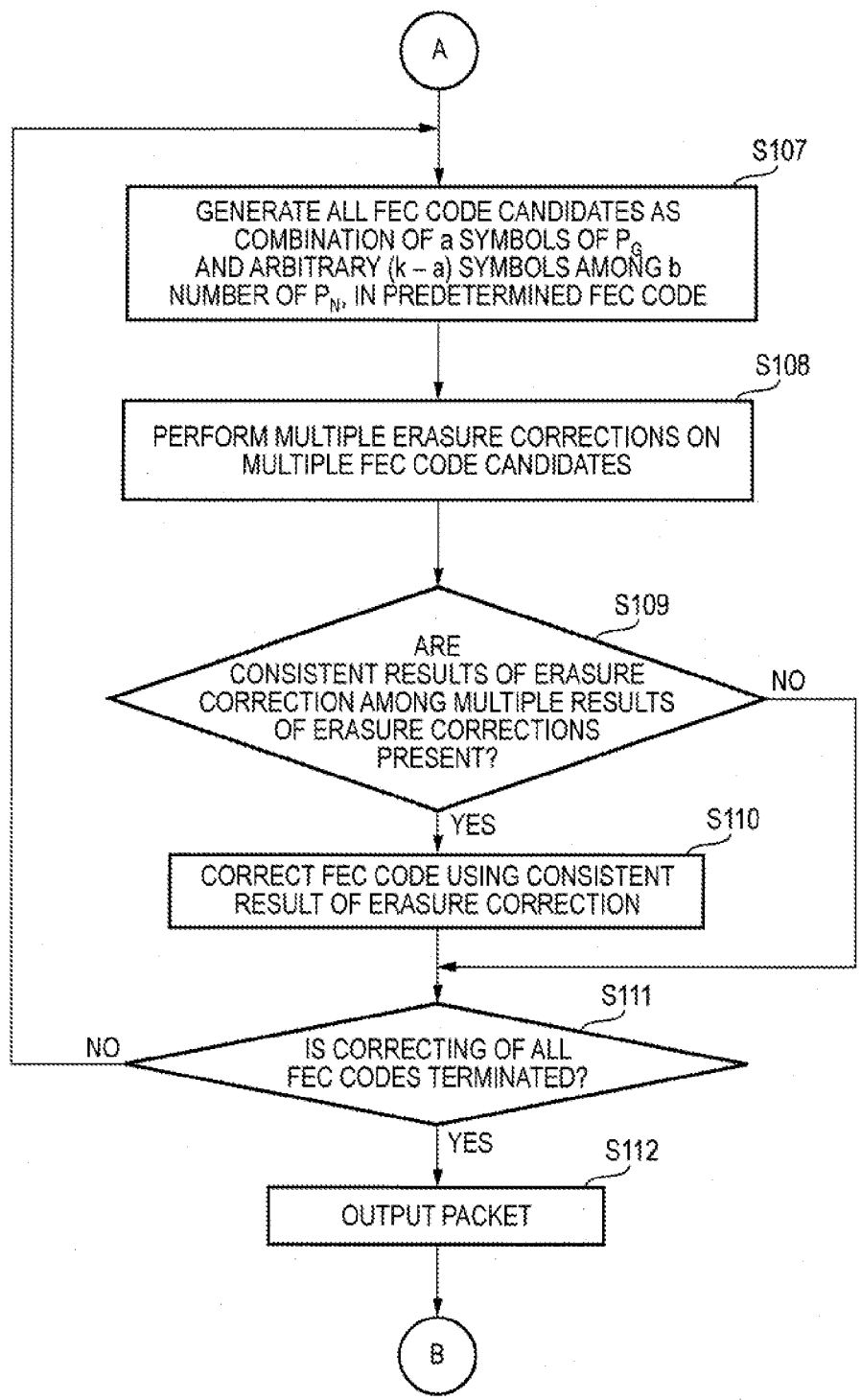
FIG. 6 is a flowchart illustrating the operation example of the reception processing unit and the operation example of the FEC decoder according to the first embodiment (continued from FIG. 5).

FIGS. 5 and 6 are flowcharts of an operation example of the reception processing unit 205 and an operation example of the FEC decoder 206. A communication program that performs the operation of the reception processing unit 205 and the operation of the FEC decoder 206 is stored in a ROM within the communication device 200 and is executed by a CPU within the communication device 200.

First, the reception processing unit 205 receives the packet (the reception packet) that is transmitted over the first channel 310 (Step S101 in FIG. 5).

The reception processing unit 205 performs the error detection on the reception packet by using the CRC of the DLC layer. Then, according to a result of the error detection, the normal reception packet ($P_G$), the abnormal reception packet ($P_N$), and the loss packet ($P_L$) are recognized and the number (a) of the normal reception packets, the number (b) of the abnormal reception packets, and the number (c) of the loss packets are counted (Step S102). The reception processing unit 205 outputs pieces of information which are $P_G$, $P_N$, $P_L$, a, b, and c, to the FEC decoder 206. That is, according to the present embodiment, not only the normal reception packet ($P_G$), but also the abnormal reception packet ($P_N$) are transferred to the FEC decoder 206 (the application layer that is an upper layer), without being discarded. Moreover, a+b+c=n is given.

Based on the pieces of information that are obtained from the reception processing unit 205, the FEC decoder 206 determines whether or not a≥k is satisfied (Step S103). Moreover, a value k indicates the number of the information symbols of the FEC code that is transmitted by the communication device 100.

If a≥k, the FEC decoder 206 performs the erasure correction on each FEC code that is included in the reception packet and restores the original data of each FEC code. Then, referring to the header of the generation packet, the packet that includes the restored FEC code is output to the image decoder 207 (Step S104).

On the other hand, if a<k, the FEC decoder 206 determines whether or not a+b≥k+1 is satisfied (Step S105).

If a+b<K+1, the FEC decoder 206 outputs the reception packet to the image decoder 207, referring to the header of the generation packet, without performing the erasure correction on each FEC code that is included in the reception packet (Step S106).

On the other hand, if a+b≥K+1, the following processing is performed on every FEC code that is included in the reception packet. Moreover, one portion of the FEC code here is lost due to an occurrence of a symbol error or the packet loss.

The FEC decoder 206 generates all the FEC decode candidates, each of which is a combination of the normal symbols of the same FEC code and the arbitrary (k−a) uncertain symbols, among the b uncertain symbols of the same FEC code described above (Step S107 in FIG. 6). Here, the normal symbol is the symbol that is included in the normal reception packet ($P_G$) and that does not include the error. The uncertain symbol is the symbol that is included in the abnormal reception packet ($P_N$) and is such a symbol that whether or not to include the symbol is uncertain. Therefore, the number of the FEC decode candidates is the same as the number (k) of the information symbols. Furthermore, the arbitrary (k−a) combinations among the b combinations have $_bC_{k-a}$ combinations in all. Therefore, $_bC_{k-a}$ FEC decode candidates are generated.

Moreover, because a=3, b=3, and k=4 in a case of the reception packet described in FIG. 4, the processing in Step S107 is performed.

Subsequently, the FEC decoder 206 performs the erasure correction on each of the generated multiple FEC decode candidates (Step S108).

Subsequently, the FEC decoder 206 determines whether or not at least one pair of consistent (the same) results of the erasure corrections, among the results of the multiple erasure corrections, is present (Step S109).

If the results of the erasure correction are consistent, the FEC decoder 206 corrects the FEC code that is included in the reception packet, using the consistent results of the erasure corrections (Step S110).

In the two FEC decode candidates, at least one bit of the symbol included in them is different, from each other, the results of performing the erasure corrections by using the two FEC decode candidates differ. When characteristics of such erasure correction (as well as the error correction) are considered, the degree of consistency of the results of performing the erasure correction on the FEC decode candidate is assumed in which the error is not present in the uncertain packet that is included in the FEC decode candidate, and a likelihood that the normal FEC code will be restored is considerably increased. Then, the consistent results of the erasure corrections are handled in the same manner as the result of the normal erasure correction that is performed using only the normal symbol, and the FEC code that is assumed to be included in the transmission packet is reproduced using the consistent results of the erasure corrections.

Specifically, the FEC decoder 206 calculates a value of the FEC code at a packet position that includes the error or the loss, as the result of the error correction, using Equation 11 described above. If the values of the FEC decodes are consistent in two or more ways of combination, among $_bC_{k-a}$ ways of combination, the values of the FEC decodes can be assumed to be the correct symbols that have been originally generated on the transmission side.

On the other hand, if the results of the erasure corrections performed on all the FEC candidates are not consistent, the FEC decoder 206 abandons the correction of the FEC code by the result of the erasure correction (No in Step S109).

After correcting the FEC code or abandoning the correction of the FEC code, the communication device 200 performs on all the FEC codes the determination of whether or not to determine the propriety of the correction of the FEC code that uses the result of the erasure correction (Step S111). The number of all the FEC codes is 1,000 in the example in FIG. 4.

If the FEC code is present on which the determination of the propriety of the correction of the FEC has not been performed, proceeding to Step S107 takes place and the same processing on the subsequent FEC code is preformed.

On the other hand, if the determination of the propriety of the correction has been performed on all the FEC codes, referring to the header of the generation packet, the FEC decoder 206 outputs the packet that reflects the correction of the FEC code to the image decoder 207 (Step S106). The propriety of the correction of the FEC code differs among the FEC codes, each of which is included in the reception packet. Therefore, for the FEC code that is included in the packet that is output, it is assumed that the FEC that can be corrected is present and the FEC that cannot be corrected is present.

According to the processing by such a reception processing unit 205 and the processing by such an FEC decoder 206, even though a condition a≥k for generally applying the erasure correction is not satisfied, the FEC code that is correctly restored can be restored by using the temporary FEC code (the FEC decode candidate) from the reception packet. The FEC code that is correct in this manner is increased, and thus, for example, image or sound quality is improved.

Moreover, in Step S108, it may be determined whether or not at least one result is consistent among the results of all the erasure corrections after performing the erasure correction on all the FEC decode candidates, but the corresponding determination may be terminated at a point in time when the results of the erasure corrections are consistent. Accordingly, an amount of processing for the arithmetic operation processing and processing time for the arithmetic operation can be reduced.

Furthermore, in Step S107, for every FEC code, without first generating the FEC decode candidate, first of all, the two FEC decode candidates may be first generated, and it may be determined whether or not the results of the erasure corrections performed on the two FEC decode candidates are consistent. Then, if the results of the erasure corrections are not consistent, processing may be repeated that newly generates the FEC decode candidate and determines whether or not the results of the erasure corrections performed on the FEC decode candidate are consistent. Accordingly, the amount of processing for the arithmetic operation and the processing time for the arithmetic operation can be reduced.

In such a communication device according to the present embodiment, the abnormal reception packet that is discarded in the related art is considered and thus the combination of the abnormal packets is generated and the multiple FEC decode candidates are generated. Then, based on the degree of consistency in the results of the multiple error corrections (the erasure correction) performed on the multiple FEC decode candidates, the FEC code that is difficult to perform the error correction on can be also restored.

That is, normally, the multiple FEC decode candidates are created by using the uncertain symbol that is such that it is impossible to determine whether or not the uncertain symbol is the normal symbol that is obtained from the packet that is discarded in a lower layer of the OK reference model, and it is possible to perform the error correction and it is possible to improve the error correction ability by using the result of the erasure correction that is obtained when the results of the erasure corrections on the multiple FEC decode candidates are consistent.

Second Embodiment

According to the present embodiment, the generation packet that is generated by the packet generator is made to have the CRC in the same manner as the transmission packet that is generated by the transmission processing unit. The CRC of the transmission packet is the CRC of the DLC layer and the CRC of the generation packet is the CRC of the application layer.

Figure 7:
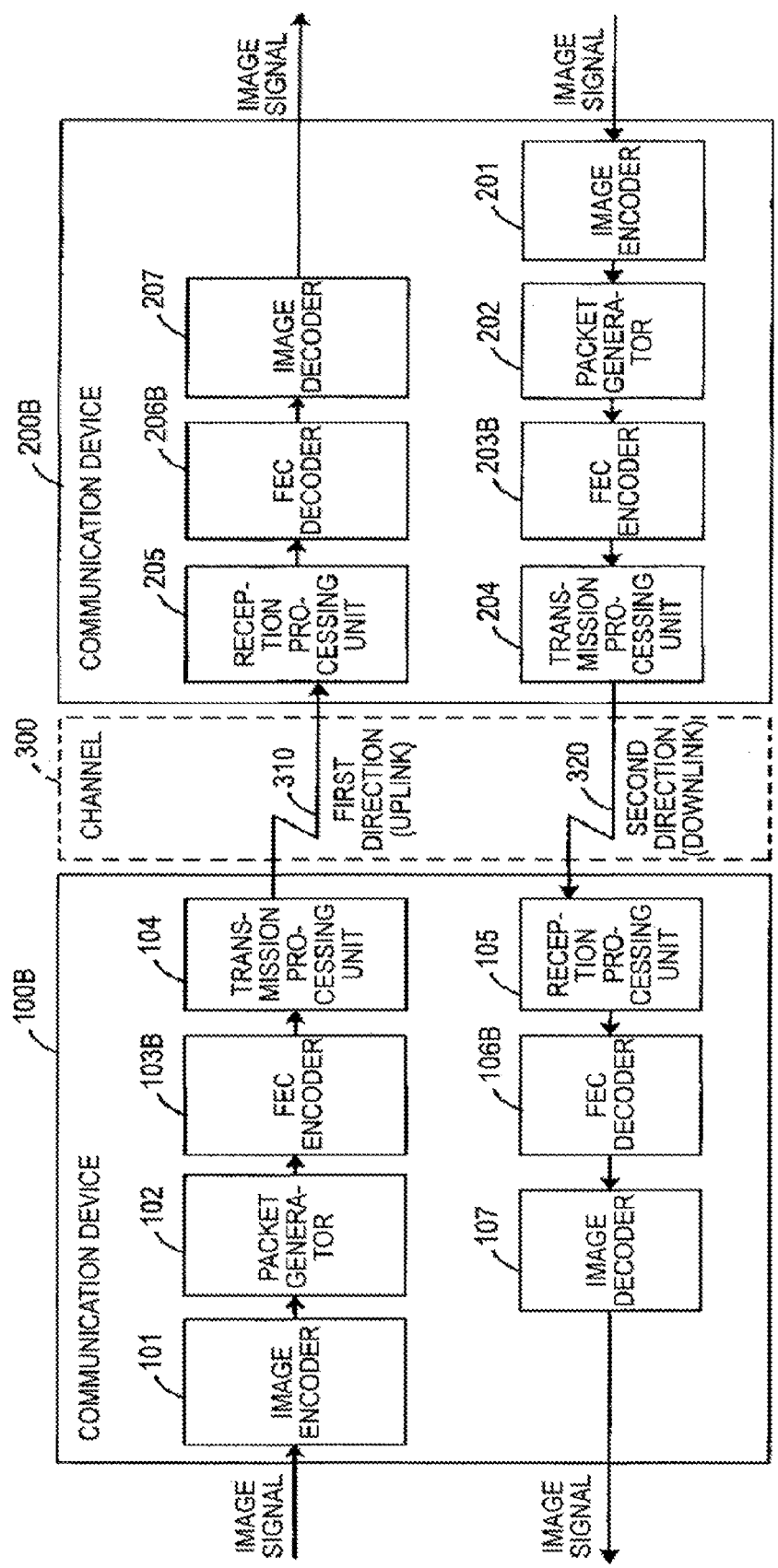
FIG. 7 is a diagram illustrating a configuration example of a communication system according to a second embodiment of the present invention.

FIG. 7 is a diagram illustrating a configuration example of a communication system according to a second embodiment of the present invention. In the communication system illustrated in FIG. 7, a communication device 100B and a communication device 200B are connected to each other over a channel 300. In the communication system illustrated in FIG. 7, constituent units that are the same as those of the communication system illustrated in FIG. 1 are given the same reference numerals and descriptions thereof are omitted or simplified.

The communication device 100B includes an FEC encoder 103B instead of the FEC encoder 103, and includes an FEC decoder 106B instead of the FEC decoder 106. In the same manner, the communication device 200B includes an FEC encoder 203B instead of the FEC encoder 203, and includes the FEC decoder 106B instead of the FEC decoder 106.

In addition to having the same function as the FEC encoder 103, the FEC encoder 103B assigns the CRC, based on the information symbol or the check symbol that is included in the generated generation packet (refer to FIG. 8 that is described below). Such a CRC is included in the generation packet and is a CRC (a CRC of the application layer) for performing the error detection in the application layer. The CRC of the application layer is data for verifying whether or not the corrected FEC code is correctly corrected.

In addition to having the same function as the FEC decoder 106, the FEC decoder 106B considers the result of the error detection that uses the CRC of the application layer that is included in the generation packet and thus performs the FEC decoding. Details of the FEC decoding are described below.

Because the FEC encoder 203B has the same function as the FEC encoder 103B, a description thereof is omitted. In the same manner, because an FEC decoder 206B has the same function as the FEC decoder 106B, a description thereof is omitted.

As in the first embodiment, the operation relating to the transmission and the operation relating to the reception are described, using operation of the communication device 100B and communication device 200B as examples, respectively. Furthermore, the RS code is assumed to be used as the FEC code. Furthermore, it is assumed that only one type of the RS (7, 4) code is used in which the number of the information symbols is 4 and the number of the check symbols is 3.

Next, the FEC encoding is described in detail.

Figure 8:
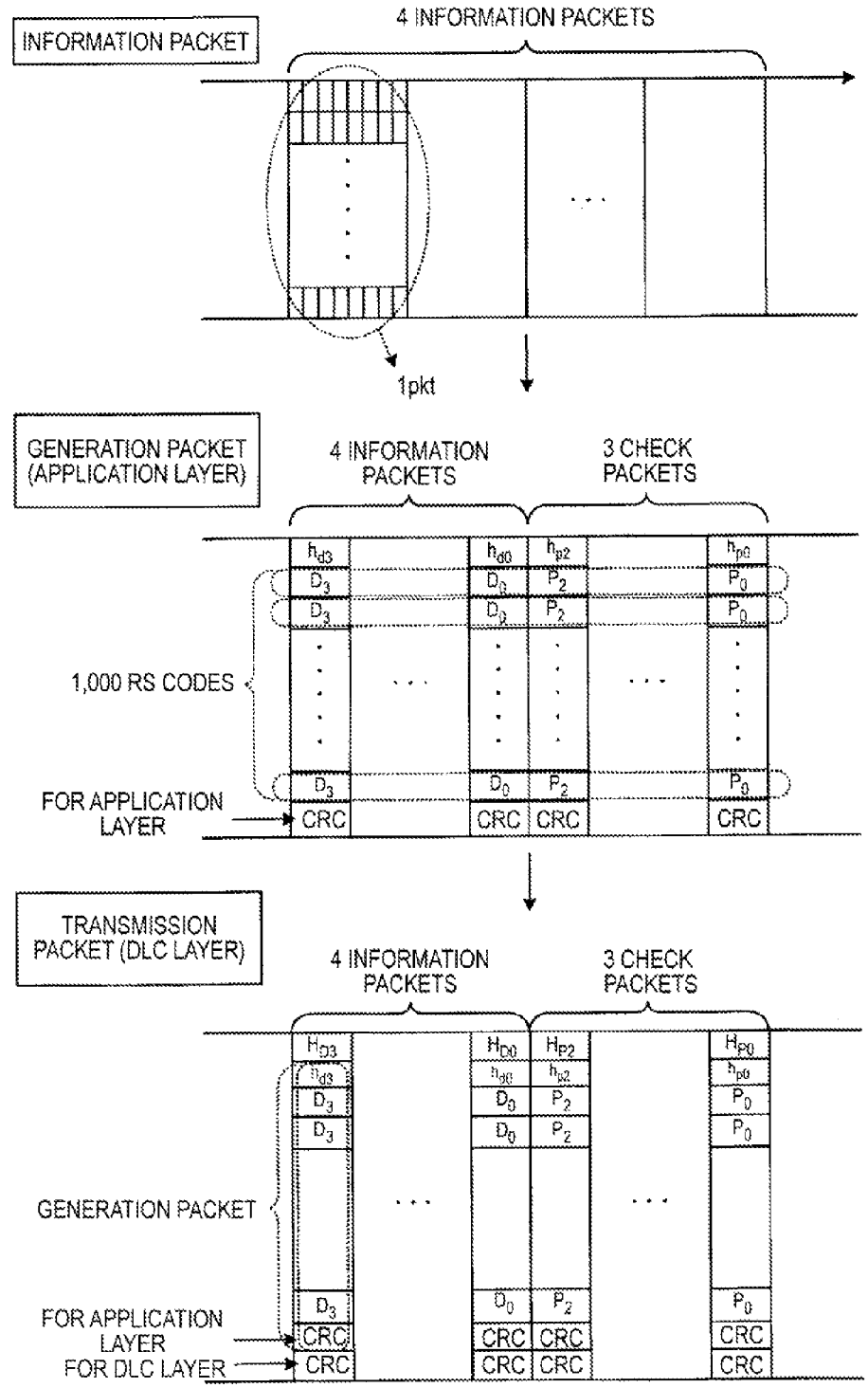
FIG. 8 is a diagram for describing the FEC encoding according to the second embodiment of the present invention.

FIG. 8 is a diagram for describing the FEC encoding. Here, what distinguishes FIG. 8 from FIG. 3 is mainly described.

The FEC encoder 103B performs the CRC encoding in a packet unit of the generation packet. That is, the CRC of the application layer is assigned based on values of 1,000 symbols that are included in the generation packet. In the example in FIG. 8, the header, the 1,000 symbols and the CRC of the application layer are included in the generation packet.

Next, the FEC decoding is described in detail.

According to the present embodiment, the erasure correction is mainly performed as the error correction. The erasure correction is described mainly below.

Figure 9:
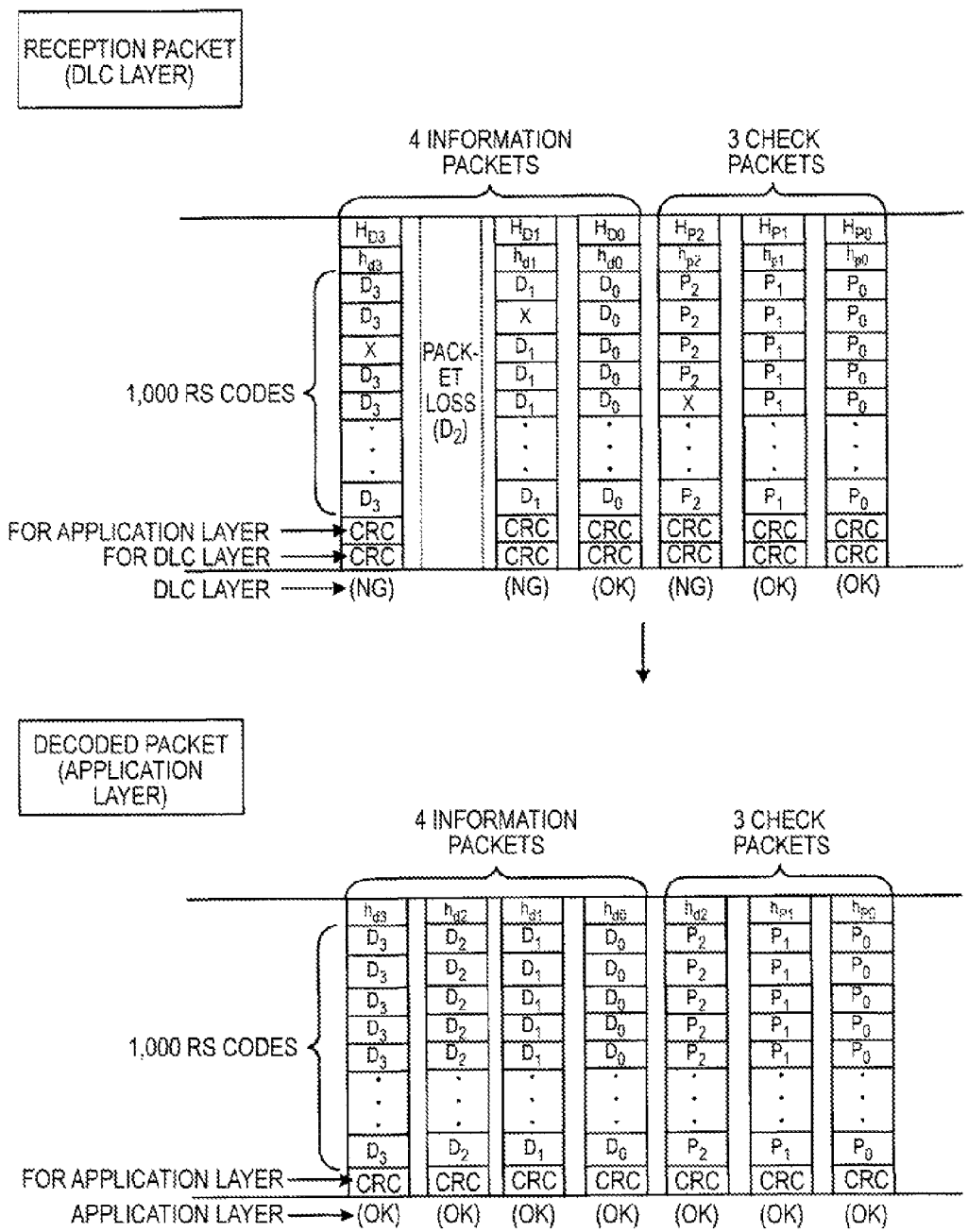
FIG. 9 is a diagram for describing the FEC decoding according to the second embodiment of the present invention.

FIG. 9 is a diagram for describing the FEC decoding. Here, what distinguishes FIG. 9 from FIG. 4 is mainly described. In FIG. 9, a case is assumed in which the error or the packet loss occurs in the same packet position as in FIG. 4.

The FEC decoder 206B receives the packet from the reception processing unit 205 and performs the erasure correction. At this time, as in the first embodiment, the FEC decode candidate is generated, and the FEC code is restored based on the result of the error correction performed on such an FEC decode candidate. If a predetermined condition is satisfied, like the decoded packet illustrated in FIG. 9, the original data can be correctly restored by the error correction described above.

Additionally, the FEC decoder 206B performs the error detection (a second error detection) on the packet in which the error symbol is corrected, using the CRC of the application layer that is assigned to such a packet. That is, the FEC decoder 206B functions as a second error detector that performs the second error detection on the corrected packet. The details are described below, but by performing such error detection, it can be verified whether or not the erasure correction is correctly performed and FEC encoding processing can be further improved.

Next, operation of the reception processing unit 205B and opera of the FEC decoder 206B are described.

Figure 10:
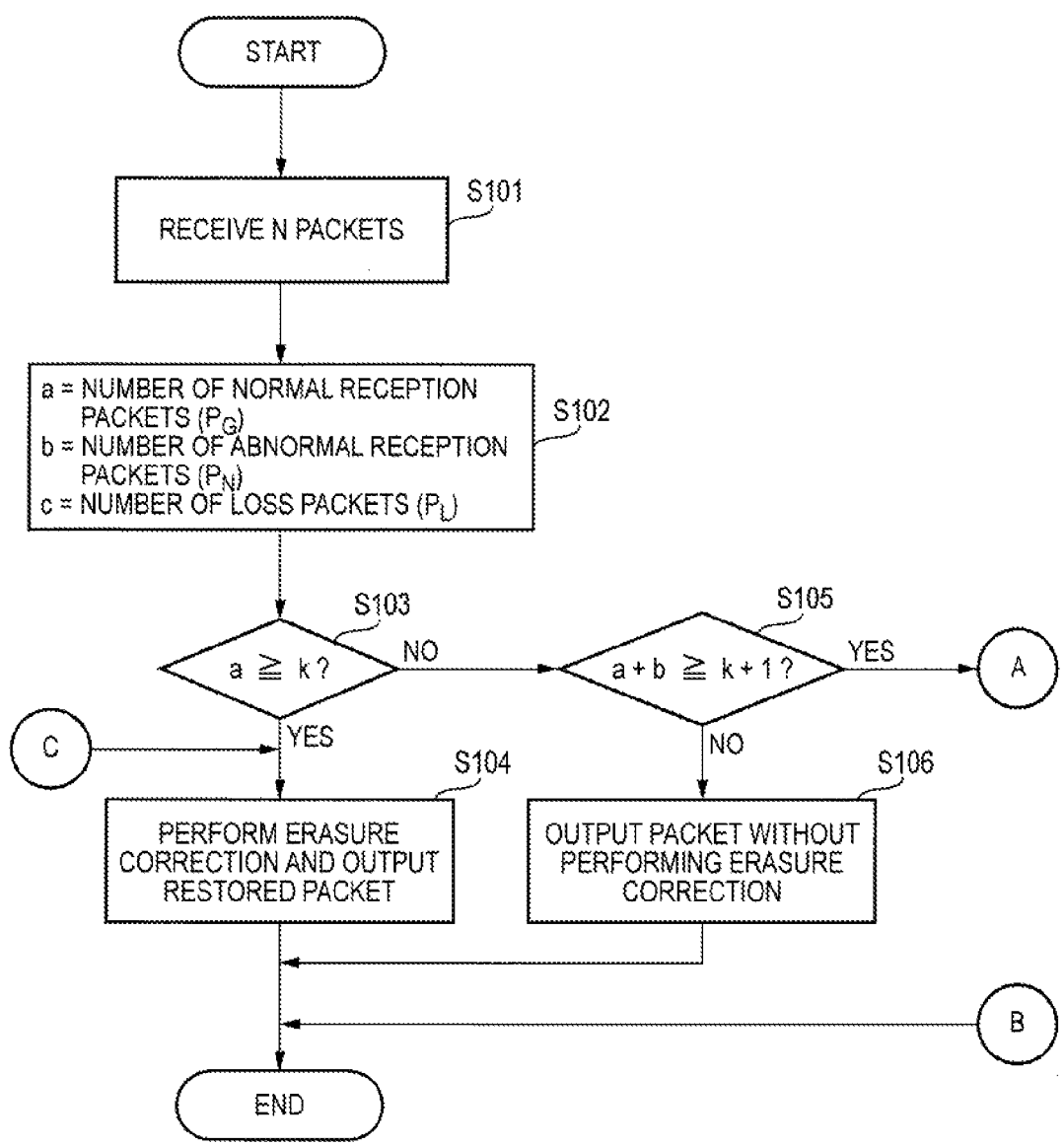
FIG. 10 is a flowchart illustrating an operation example of a reception processing unit and an operation example of an FEC decoder according to the second embodiment of the present invention.
Figure 11:
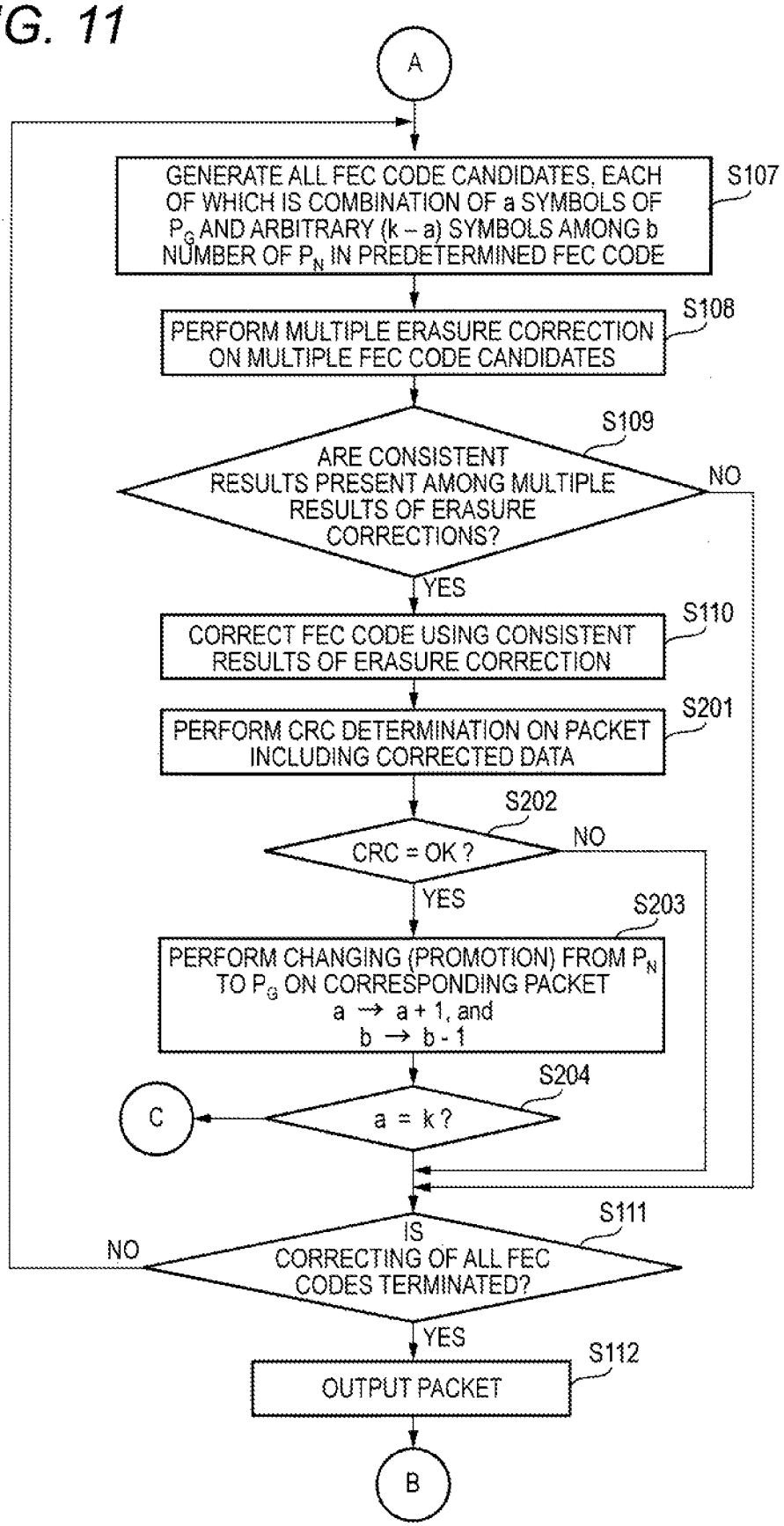
FIG. 11 is a flowchart, illustrating the operation example of the reception processing unit and the operation example of the FEC decoder according to the second embodiment of the present invention (continued from FIG. 10).

FIGS. 10 and 11 are flowcharts illustrating an operation example of the reception processing unit 205B and an operation example of the FEC decoder 206B. A communication program that performs the operation of the reception processing unit 205B and the operation of the FEC decoder 206B is stored in a ROM within the communication device 200B and is executed by a CPU within the communication device 200B. Moreover, in FIGS. 10 and 11, descriptions of the same steps as those in FIGS. 5 and 0 are omitted or are simplified.

After the processing in Step S110 in FIG. 11, the FEC decoder 206B performs the error detection on the packet that includes the symbol that is corrected in Step S110, using the CRC of the application layer that is included in the corresponding packet (Step S201).

As a result of the error detection using the CRC of the application layer, the FEC decoder 206B determines whether the error symbol is included in the error detection-target packet or not (CRC=OK) (Step S202). If the error symbol is included in the error detection-target packet (CRC=NG), proceeding to Step S111 takes place.

If it is determined that the error symbol is not included in the error detection-target packet, that is, if the error symbol that occurs at the time of the communication is correctly corrected, the FEC decoder 206B changes (promotes) the corresponding packet from the abnormal reception packet $P_N$ to the normal reception packet $P_G$. Furthermore, the FEC decoder 206B adds 1 to the number (a) of the normal reception packets (a←a+1) and subtracts 1 from the number (b) of the abnormal reception packets (b←b−1) (Step S203).

Subsequently, the FEC decoder 206B considers the promotion of the packet described above and thus determines whether or not a≥k is satisfied (Step S204). If a≥k is not satisfied, that is, if a<k, proceeding to Step S111 takes place.

If a≥k is satisfied, proceeding to Step S104 in FIG. 10 takes place. That is, as a result of promoting the abnormal reception packet to the normal reception packet, if all the error symbols of such a packet are corrected, it is presumed that the symbol of the corresponding packet will be not the error symbol in the other (subsequent) FEC codes. Furthermore, as a result of the promotion, if the number (a) of the normal reception packets is equal to or more than the number (k) of the information packets, the FEC code can be restored by the erasure correction performed on the general FEC code without performing up to the erasure correction on the FE decode candidate. Therefore, because processing tasks in Steps S107 to S111 and S201 to S204 that are performed on the subsequent FEC codes can be omitted and an amount of the arithmetic operation can be decreased, processing load on the communication device 200B can be reduced.

In this manner, as a result of correcting the FEC code, if the number (a) of the normal reception packets is equal to or more than the number (k) of the information packets, the FEC decoder 206B may stop the error correction that is performed on the FEC decode candidate of the subsequent FEC decode, and may perform the error correction on the subsequent FEC code that is included in the reception packet.

Moreover, the error detection that uses the CRC of the application layer in Step S202 may be performed every processing that is performed on one FEC code or may be performed every processing that is performed on some of the FEC codes, that is, the frequency with which the processing is performed may be reduced.

In the communication device 200B according to the present embodiment, by performing the error detection that uses the CRC of the application layer, it can be verified whether or not the error symbol is reliably corrected. For example, in a certain FEC code, there is also a likelihood that no consistency will be present in the results of the error correction that are performed on the FEC decode candidate and that an FEC code not corrected will be included. Even though such a case occurs, reliability can be improved by performing the error detection that uses the CRC of the application.

Furthermore, if the error symbol is corrected and thus the general erasure correction can be performed, the subsequent erasure correction can be easily performed and the processing load on the communication device 200B can be reduced.

Moreover, the present invention is not limited to the embodiments described above, and can be applied to whatever configuration can accomplish functions recited in claims, or functions performed by the configuration of each of the embodiments described above.

According to the embodiments described above, the communication device is described as performing the processing by the reception processing unit or the processing by the FEC decoder as illustrated in FIGS. 5, 6, 10, 11, and so forth, but for example, the reception packet that includes the image data that is communicated may be output to the external device through a cable, a medium, or the like, and the processing may be performed by the reception processing unit or the FEC decoder in the corresponding external device.

According to the embodiments described above, the erasure correction in which a position where the error or the packet loss occurs is ascertained is described as an example, but if a condition is satisfied that the number of the reception packets for performing the error correction needs to be larger than the number of the reception packets for performing the erasure correction, it is, of course, possible also to apply the error correction in which the packet position described above is not ascertained.

According to the embodiments described above, the use of the CRC of the application layer and the CRC of the DLC layer is described, but the present invention is not limited to this and another CRC (for example, a CRC of a transport layer) in a lower layer than in the application may be used.

According to the embodiments described above, it is best to use all the normal symbols in the erasure correction, but without using some of all the normal symbols, the erasure correction may be performed by using the uncertain symbol instead.

According to the embodiments described above, the number of the symbols of the FEC decode candidate is described as being the same as the number of the information symbols, but the present invention is not limited to this and the number of the symbols of the FEC decode candidate may be equal to or more than the number of the information symbols. If the number of the symbols of the FEC decode candidate is the same as the number of the information symbols, because the number of the uncertain symbols that are used in the arithmetic operation for the erasure correction is small, the probability of obtaining consistence in the results of the arithmetic operation for the erasure correction can be increased. On the other hand, if the number of the symbols of the FEC decode candidate is equal to or more than the number of the information symbols, the amount of the arithmetic operation for the erasure correction can be reduced.

Furthermore, an application scope of the present invention includes the communication program that realizes the function according to the embodiments described above as well, which is supplied to the communication device over a network or through various storage media and which is read by a computer (a CPU) within such a communication device and is executed.

A communication device according to an aspect of the present invention is a communication device for performing a communication with a different communication device, the communication device including: a receiver that receives reception packets including information packets that contains information symbols and check packets that contains check symbols and divides each packet into a plurality of symbols, wherein the information packets and the check packets configure FEC codes; a first error detector that detects whether each packet of the reception packets is a normal reception packet or an abnormal reception packet; a first error correcting unit that generates a plurality of FEC decode candidates for each of the FEC codes and performs a first error correction on the plurality of FEC decode candidates, wherein each of the plurality of FEC decode candidates is configured by a normal symbol included in the normal reception packet and an uncertain symbol included in the abnormal reception packet and generated to have the uncertain symbol different from one another; and a second error correcting unit that corrects the FEC codes based on consistent results of the first error correction among a plurality of results of the first error correction that is performed on the plurality of FEC decode candidates by the first error correcting unit.

With the communication device, the FEC code that is difficult to perform the error correction (a second error correction) on can be restored based on the degree of consistency of the results of multiple error corrections (a first error corrections) that are performed on the plurality of FEC decode candidates. At this time, the error correction can be performed by using the packet that is normally discarded in a comparatively low layer (a DLC layer and so on). Therefore, it is possible to improve the error correction ability.

The communication device according to the aspect of the present invention may be configured so that the first error correcting unit generates the plurality of FEC decode candidates for each of the FEC codes if a number of the normal reception packets in each of which an error is not detected by the first error detector is less than a number of the information packets and a number of the reception packets is equal to or more than the number of the information packets, wherein each of the plurality of FEC decode candidates is configured by all the normal symbols included in the normal reception packet and some of the uncertain symbols included in the abnormal reception packet in which an error is detected by the first error detector, and generated to have the uncertain symbols different from one another.

With the communication device, the FEC code that is difficult to perform the error correction (the second error correction) on can be restored based on the degree of consistency of the results of the multiple error corrections (the first error corrections) that are performed on the plurality of FEC decode candidates. Therefore, it is possible to improve the error correction ability.

The communication device according to the aspect of the present invention may be configured so that a number of symbols of the FEC decode candidate is the same as the number of the information symbols.

With this communication device, the error correction can be performed by using the symbols of the FEC decode candidates, the number of which is the minimum necessary for performing the error correction.

The communication device according to the aspect of the present invention may be configured so that the second error correcting unit calculates a transmission symbol included in a transmission packet that is transmitted by the different communication device for each of the FEC codes, based on a value of the uncertain symbol included in the abnormal reception packet and on a value of an error symbol included in the abnormal packet, which is obtained by the consistent results of the first error correction.

With the communication device, while using an arithmetic operation equation for a general error correction, the FEC code which is difficult to perform the error correction on can also be restored.

The communication device according to the aspect of the present invention may be configured by including a second error detector that performs a second error detection on a correction packet which is a packet that is corrected by the second error correction unit, wherein the second error correcting unit changes the correction packet from the abnormal reception packet to the normal reception packet if the error is not detected by the second error detector.

With the communication device, the reliable correction of the FEC code by the second error correction can be verified. Furthermore, it can be ensured that the error symbol is not included in the subsequent FEC code within the same packet.

The communication device according to the aspect of the present invention may be configured so that the first error correcting unit stops the first error correction to be performed on the FEC decode candidate of a subsequent FEC code and performs the first error correction on the subsequent FEC code if a number of the normal reception packets is equal to or more than the number of the information packets as a result of correcting the FEC code by the FEC code correcting unit.

With the communication device, as a result of the first error correction, if the number of the normal reception packets is increased and thus becomes equal to or more than the number of the information packets, because the general error correction (the second error correction) can be made to be performed, an amount of arithmetic operation can be decreased by making the processing for the error correction easy.

A communication method according to an aspect of the present invention includes the steps of: receiving reception packets and dividing each packet into a plurality of symbols; performing a first error correction using a plurality of FEC decode candidates configured by normal symbols and uncertain symbols included in the divided symbols; and performing a second error correction using consistent results among a plurality of results of the first error correction.

With this communication method, based on the degree of consistency of the results of the multiple error corrections that are performed on the plurality of FEC code candidates, the FEC code that is difficult to perform the error correction on can be also restored. At this time, the error correction can be performed by using the packet that is normally abandoned in the comparatively low layer (the DLC layer and so on). Therefore, it is possible to improve the error correction ability.

A communication program according to an aspect of the present invention is a program for causing a computer to execute each step of the communication method.

With this communication program, based on the degree of consistency of the results of the multiple error corrections that are performed on the plurality of FEC candidates, the FEC code that is difficult to perform the error correction on can be also restored. Therefore, it is possible to improve the error correction ability.

The present invention is described in detail or referring to the specific embodiments, but it is apparent to an ordinary skilled person in the art that various changes or modifications can be made without deviating from the spirit and scope of the present invention.

The present invention is useful in a communication device, a communication program, and the like that are capable of improving error correction ability.

The present application is a continuation-in-part of international application No. PCT/JP2012/007412 filed on Nov. 19, 2012 claiming the priority of Japanese patent application No. 2011-263958 filed on Dec. 1, 2011, the contents of which are incorporated herein by reference in its entirety.

What is claimed is:

1. A communication device for performing a communication with a different communication device, the communication device comprising:
    a receiver that receives reception packets including information packets that contains information symbols and check packets that contains check symbols and divides each packet into a plurality of symbols, wherein the information packets and the check packets configure FEC (Forward Error Correction) codes;
    a first error detector that detects whether each packet of the reception packets is a normal reception packet or an abnormal reception packet;
    a first error correcting unit that generates a plurality of FEC decode candidates for each of the FEC codes and performs a first error correction on the plurality of FEC decode candidates, wherein each of the plurality of FEC decode candidates is configured by a normal symbol included in the normal reception packet and an uncertain symbol included in the abnormal reception packet and generated to have the uncertain symbol different from one another; and
    a second error correcting unit that corrects the FEC codes based on consistent results of the first error correction among a plurality of results of the first error correction that is performed on the plurality of FEC decode candidates by the first, error correcting unit.

2. The communication device according to claim 1, wherein the first error detector transfers the reception packets to the first error correcting unit irrespective of the normal reception packet or the abnormal reception packet without being discarded.

3. The communication device according to claim 1, wherein
    the first, error correcting unit generates the plurality of FEC decode candidates for each of the FEC codes if a number of the normal reception packets in each of which an error is not detected by the first error detector is less than a number of the information packets and a number of the reception packets is equal to or more than the number of the information packets, wherein each of the plurality of FEC decode candidates is configured by all the normal symbols included in the normal reception packet and some of the uncertain symbols included in the abnormal reception packet in which an error is detected by the first error detector, and generated to have the uncertain symbols different from one another.

4. The communication device according to claim 3, wherein
    a number of symbols of the FEC decode candidate is the same as the number of the information symbols.

5. The communication device according to claim 3, wherein
    the second error correcting unit calculates a transmission symbol included in a transmission packet that is transmitted by the different communication device for each of the FEC codes, based on a value of the uncertain symbol included in the abnormal reception packet and on a value of an error symbol included in the abnormal packet, which is obtained by the consistent results of the first error correction.

6. The communication device according to claim 3, further comprising:
    a second error detector that performs a second error detection on a correction packet which is a packet that is corrected by the second error correction unit, wherein
    the second error correcting unit changes the correction packet from the abnormal reception packet to the normal reception packet if the error is not detected by the second error detector.

7. The communication device according to claim 6, wherein
    the first error correcting unit stops the first error correction to be performed on the FEC decode candidate of a subsequent FEC code and performs the first error correction on the subsequent FEC code if a number of the normal reception packets is equal to or more than the number of the information packets as a result of correcting the FEC code by the FEC code correcting unit.

8. The communication device according to claim 6, wherein the first error detector performs the first, error detection using a first CRC (Cyclic Redundancy Check), and the second error detector performs the second error detection using a second CRC, wherein the second CRC is an upper layer than the first CRC.

9. The communication device according to claim 8, wherein the first CRC indicates a CRC in a DLC (Data Link Control) layer, and the second CRC indicates a CRC in an application layer.

10. The communication device according to claim 1, wherein the first error detector performs the first error detection using a first CRC (Cyclic Redundancy Check) in a DLC (Data Link Control) layer, and
    the first error correcting unit performs the first correcting process and the second error correcting unit corrects the FEC codes in an application layer.

11. A communication method in a communication device for performing a communication with a different communication device, the communication method comprising:
    receiving reception packets including information packets that contains information symbols and check packets that contains check symbols and divides each packet into a plurality of symbols, wherein the information packets and the check packets configure FEC (Forward Error Correction) codes;
    detecting whether each packet of the reception packets is a normal reception packet or an abnormal reception packet;
    generating a plurality of FEC decode candidates for each of the FEC codes and performs a first error correction on the plurality of FEC decode candidates, wherein each of the plurality of FEC decode candidates is configured by a normal symbol included in the normal reception packet and an uncertain symbol included in the abnormal reception packet and generated to have the uncertain symbol different from one another; and
    correcting the FEC codes based on consistent results of the first error correction among a plurality of results of the first error correction that is performed on the plurality of FEC decode candidates by the first error correction.

12. A non-transitory storage medium in which a communication program is stored for causing a computer to execute each step of the communication method according to claim 11.

* * * * *